United States Patent [19]

Petratos et al.

[11] Patent Number: 4,680,676
[45] Date of Patent: Jul. 14, 1987

[54] PORTABLE RADIO HOUSING WITH LOGIC AND RF SHIELDING

[75] Inventors: Nickie A. Petratos, Sunrise; David Karl, Tamarac; William M. Bradford, Fort Lauderdale, all of Fla.

[73] Assignee: Motorola, Inc., Schaumburg, Ill.

[21] Appl. No.: 816,521

[22] Filed: Jan. 6, 1986

[51] Int. Cl.[4] ............................................. H05K 7/06
[52] U.S. Cl. .................................... 361/424; 455/301; 361/399; 361/413
[58] Field of Search ....................... 334/85; 174/35 R; 455/301, 300, 344, 347–351; 361/386, 388, 391, 395, 396, 399, 412, 413, 417, 419, 422, 424; 339/143 R, 17 LM, 17 M, 17 N

[56] References Cited

U.S. PATENT DOCUMENTS

| | | | |
|---|---|---|---|
| 1,968,557 | 7/1934 | Johanson | 455/301 |
| 2,921,523 | 1/1960 | Larsen | 455/301 |
| 2,995,686 | 8/1961 | Selvin | 361/395 |
| 3,029,368 | 4/1962 | Wulc | 455/301 |
| 3,048,747 | 8/1962 | Errichiello | 455/301 |
| 3,479,622 | 11/1969 | Freer | 455/301 |
| 4,339,628 | 7/1982 | Marcantonio et al. | 174/35 R |
| 4,362,918 | 12/1982 | Rabin | 219/10.81 |
| 4,370,700 | 1/1983 | Duddles | 361/424 |
| 4,399,487 | 8/1963 | Neumann | 361/391 |
| 4,419,770 | 12/1983 | Yagi et al. | 455/301 |
| 4,455,682 | 6/1984 | Masters | 455/300 |
| 4,599,680 | 7/1986 | Gibson | 361/424 |

Primary Examiner—G. P. Tolin
Attorney, Agent, or Firm—Martin J. McKinley; Daniel K. Nichols; Joseph T. Downey

[57] ABSTRACT

A portable radio housing has a shield that provides electromagnetic isolation between logic and radio boards operating on close frequencies. The radio board is positioned in a conductive frame having fours sides surrounding a central opening. A tab on the frame is connected to a power module on the radio board to sink heat from the power module. A middle shield having sides with integral spring fingers at calculated intervals is attached to the frame over the rear surface of the radio board. A logic board and rear shield are attached to the frame over the middle shield. A connector protrudes through an opening in the middle shield and interconnects the logic and radio boards. A front shield, also having sides with integral spring fingers, is attached to the frame over the front surface of the radio board. The front shield has an integral speaker baffle and tabs for holding a connector. An outer housing and keypad/display module enclose the frame. Electrostatic discharge protection is provided by connecting exposed metal parts to the frame.

14 Claims, 2 Drawing Figures

PORTABLE RADIO HOUSING WITH LOGIC AND RF SHIELDING

BACKGROUND OF THE INVENTION

This invention relates to the field of electromagnetic shields and more particularly to housings that shield logic and RF components in portable radios.

The trend in two-way portable radio design has been to use a digital controller to control the functions of the radio, especially in more sophisticated radios such as frequency synthesized and "trunked" radios. Because portable radios are battery operated, low current CMOS microprocessors and logic circuits are usually employed in the controller to extend the radio's operating time between battery charges. It is well known that CMOS microprocessors and logic circuits consume less current when they are operated at lower frequencies, therefore, it is desirable to clock the controller at less than its maximum operating frequency to enhance battery life. Reducing the controller's clock frequency, however, can bring it very close to the radio's receiver IF frequency, causing interference problems. When these two frequencies are close, shielding the radio receiver circuits from the controller becomes difficult because the limited space available in a small portable radio requires that the radio and controller be in close proximity. Similarly, the controller must be shielded from any high power RF transmiter circuits in the radio, while both the radio and controller must also be shielded from the environment.

In a portable radio having controller clock and radio receiver IF frequencies of 450 and 455 KHz respectively, approximately 90 dB of attenuation is required between the controller and the radio to reduce interference to an acceptable level. The use of prior art conductive coatings, however, only provides approximately 20 dB of attentuation. In this application, therefore, a portable radio housing must include an electromagnetic shield that provides at least 90 dB of attenuation between the controller and radio to prevent mutual interference, and it must also provide electromagnetic isolation from the environment.

Because of the size and weight constraints of portable radios, it would be advantageous to build non-shielding functions into the shield. For example, it would be desirable to use the shield as the structural foundation for the radio, to provide acoustic baffling for the radio speaker, and to utilize its mass to sink heat from various power modules in the radio. It would also be advantageous to build shock isolation into the housing as well as utilize the shield to discharge excess static charge which comes into contact with the external controls of the radio.

SUMMARY of the INVENTION

Briefly, the invention is a housing for electromagnetically shielding electronic circuits and includes a conductive frame having a multiplicity of sides surrounding a central opening. A first circuit substrate having front and rear surfaces is positioned in the opening of the frame. A first electromagnetic shield is positioned over the rear surface of the first substrate. The first shield has front and rear surfaces, a plurality of sides substantially perpendicular to the surfaces, and an opening. Certain of the sides of the first shield have spring fingers for contacting the frame. A second circuit substrate having front and rear surfaces is positioned over the rear surface of the first shield. An electrical interconnection is included between the first and second circuit substrates. The electrical interconnection includes first and second mating connectors respectively connected to the first and second substrates. The electrical interconnection passes through the opening in the first shield. Also included is a second electromagnetic shield positioned over the rear surface of the second circuit substrate.

DESCRIPTION of the PREFERRED EMBODIMENT

Figure 1:
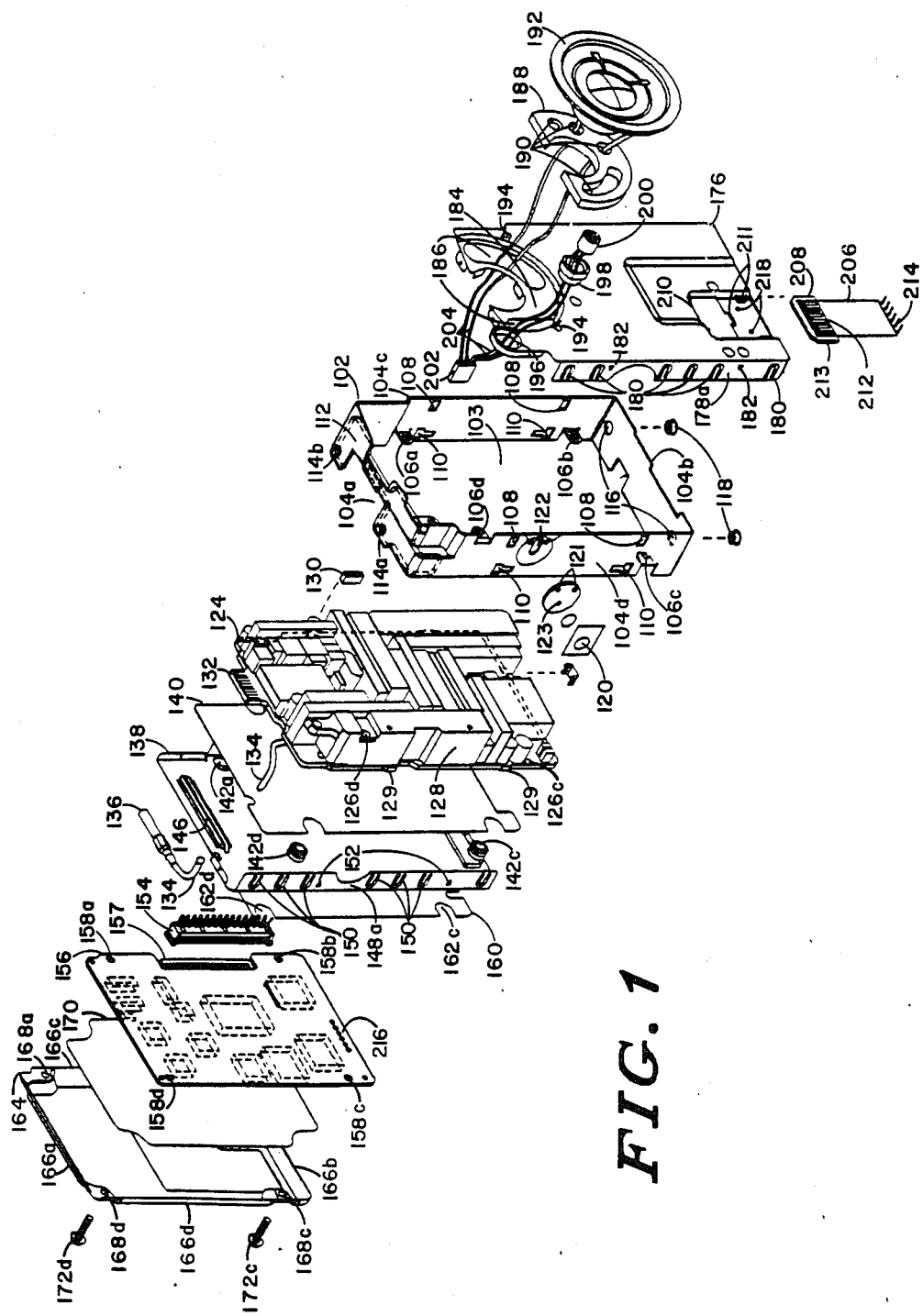
FIG. 1 is an exploded perspective view of the main shield assembly.

FIG. 1 is an exploded perspective view of the main shield assembly 100. A conductive frame 102, having four sides 104a-104d surrounding a central opening 103, provides structural support for shield assembly 100. Two tabs 106a and 106b extend inwardly from side 104c while two tabs 106c and 106d extend inwardly from side 104d of frame 102. Tabs 106a-106d each have a threaded hole suitable for accepting a screw. Tabs 106a and 106b are positioned towards the rear of side 104c. Tab 106c is positioned towards the rear of side 104d while tab 106d is positioned towards the front of side 104d. Sides 104c and 104d each have two front slots 108 and two rear slots 110. Slots 110 each have widened portions at one end of the slot which make them suitable for accepting two different size tabs or protuberances. Side 104a has a cold rolled steel reinforcing bracket 112 welded underneath and two threaded holes 114a and 114b extend through side 104a and bracket 112. Side 104b has two holes 116 in which two self clinching threaded inserts 118 are inserted and secured. A single pole single throw (SPST) "popple" switch 120 is attached to frame 102, preferably by soldering one terminal 121 to side 104d. Side 104d of frame 102 has a hole 122 positioned underneath switch 120 to provide wiring access to the second terminal 123 of the switch.

Radio board 124, preferably a multi-layer printed circuit board, has various individual radio modules and components attached to its front surface, preferably by soldering or through miniature pins and sockets. Radio board 124 is preferably a multi-layer printed circuit board, although other well known circuit substrates are also suitable. Radio board 124 has four holes 126a-126d (126a and 126b are not visible in FIG. 1) extending through the board and in alignment with the threaded holes in tabs 106a-126d. Hole 106d extends upwardly from radio board 124 through power module 128. Two opposing edges of radio board 124 each have two tabs 129 (only one edge with tabs is visible in FIG. 1) suitable for engaging slots 110 of frame 102. Radio board 124 also has a speaker/microphone connector 130 attached to its front surface. A printed circuit board-type edge connector 132 extends upward from radio board 124. Extending from the back of radio board 124 is an antenna cable 134 with an RF connector 136 attached at the other end.

A middle shield 138 has front and rear surfaces and is positioned behind radio board 124. An insulator 140, preferably a thin plastic sheet, is adhered to the front surface of middle shield 138. Middle shield 138 has holes 142a–142d (hole 142b is not visible in FIG. 1) in alignment with the holes in tabs 106a–106d. Formed on the rear surface of middle shield 138 is an indentation 146 suitable for accepting antenna connector 136. Middle shield 138 has two sides 148a and 148b (148b is not visible in FIG. 1) which are substantially perpendicular to the front surface and respectively overlap sides 104d and 104c of frame 102. Sides 148a and 148b have integral spring fingers 150 to provide electrical contact at calculated intervals to frame 102. The separation between spring fingers 150 is dependent upon the frequency of the circuits on radio board 124 and the separations are calculated by using well known electromagnetic shielding theory. Two protuberances 152 on each side 148a and 148b of middle shield 138 extend inwardly and seat in holes 110 of frame 102, thereby securing middle shield 138 to frame 102. An insulator 160, preferably a thin plastic sheet, is adhered to the rear surface of middle shield 138. Insulator 160 also has four holes 162a–162d (holes 162a–162b are not visible in FIG. 1) also in alignment with the holes in tabs 106a–106d of frame 102. A connector 154, preferably a printed circuit board-type edge connector, is positioned through holes (not illustrated) in middle shield 138 and insulators 140 and 160 and attached to the rear surface of radio board 124, preferably by soldering.

A logic board 156 has various integrated circuits attached to its rear surface, preferably in chip carriers or flat packs. Logic board 156 is preferably a polyimide printed circuit board, although other well known circuit substartes are also suitable. Logic board 156 has four holes 158a–158d in alignment with the holes in tabs 106a–106d of frame 102. Logic board 156 also has a male printed circuit board-type edge connector 157 suitable for engaging connector 154. Although the preferred application for the present invention is to shield radio and logic components, it is to be understood that circuit substrates 124 and 156 may support other types of circuits.

A rear shield 164 has four sides 166a–166d and holes 168a–168d which are in alignment with the holes of tabs 106a–106d of frame 102. An insulator 170, preferably a thin plastic sheet, is adhered to the forward surface of rear shield 164.

To partially assemble shield assembly 100, radio board 124 is inserted into the opening of frame 102 from the rear until tabs 106a–106c come into contact with radio board 124, tab 106d comes into contact with power module 128, and tabs 129 snap into slots 110. Next, middle shield 138 with attached insulators 140 and 160 is snapped into position over the rear surface of radio board 124 and over frame 102 by inserting protuberances 152 into slots 110 of frame 102. Connector 154, which is attached to the rear surface of radio board 124, now extends rearward of middle shield 128 through the aforementioned hole. Logic board 156 is then attached to the partial assembly by sliding printed circuit board male connector 157 into mating connector 154. Rear shield 164 with attached insulator 170 is then placed over logic board 156 such that logic board 156 is completely enclosed by rear shield 164 and middle shield 138. At this point, the aforementioned holes in radio board 124, insulator 140, middle shield 138, insulator 160, logic board 156, insulator 170, and rear shield 164 should all be in alignment with the holes in tabs 106a–106d of frame 102. Radio board 124, logic board 156, middle shield 138, and rear shield 164 are then secured to frame 102 with fasteners, preferably four screws 172a–172d (screws 172a–172b are not shown in FIG. 1) inserted through the aforementioned holes and threaded into the holes in tabs 106a–106d. It will be noted that tab 106d, unlike tabs 106a–106c, is connected directly to power module 128. This permits frame 102 to function as a heat sink for power module 128.

A front shield 176 has sides 178a and 178b (178b is not visible in FIG. 1) which are substantially perpendicular to the rear surface of the shield. To provide for optimized reflective shielding, conductivity, and structural strength, front shield 176, middle shield 138, rear shield 164, and frame 102 are preferably constructed from tin plated CDA #770 nickel silver, although tin plated cold rolled steel may also be satisfactory. Sides 178a and 178b have integral spring fingers 180 similar in design to spring fingers 150 of middle shield 138. Each side 178a and 178b has two protuberances 182 which project inwardly. Formed on the front surface of front shield 176 is a recessed baffle portion 184 having two baffle holes 186. A partially ring shaped foam baffle 188 having baffle holes 190 and adhesive backing on its front and rear surfaces is positioned over recess 184. A permanent magnet speaker 192 is positioned over foam baffle 188 and secured to front shield 176 by bending tabs 194 around the outer perimeter of speaker 192. Front shield 176 also has a microphone hole 196 into which a rubber sleeve 198 and microphone 200 are inserted. Speaker 192 and microphone 200 are electrically connected to connector 202 through wires 204.

A flex circuit 206 has a connector 208 on one end which is inserted into a recess 210 in front shield 176 and retained by protruding tabs 211. Connector 208 includes exposed metal contacts 212, preferably gold plated, on the surface of flex circuit 206 and a printed circuit board 213 is bonded to the rear surface of flex 206. At the other end of flex circuit 206, pins 214 are attached to flex circuit 206 and then soldered into holes 216 on the front surface of logic board 156.

To attach front shield 176 to frame 102, and thereby complete the assembly of shield assembly 100, connector 202 is inserted into mating connector 130 of radio board 124. Front shield 176 is then snapped over frame 102 such that protuberances 182 seat into slots 108 of frame 102. As with middle shield 138, sides 178a and 178b extend over sides 104c and 104d of frame 102 with integral spring fingers 180 electrically contacting the sides. Next, connector 208 is attached to front shield 176 by sliding circuit board 213 under tabs 211. To retain connector 208 in front shield 176, two detents (not shown) on the rear side of circuit board 213 mate with two protuberances 218 positioned in recess 210.

Figure 2:
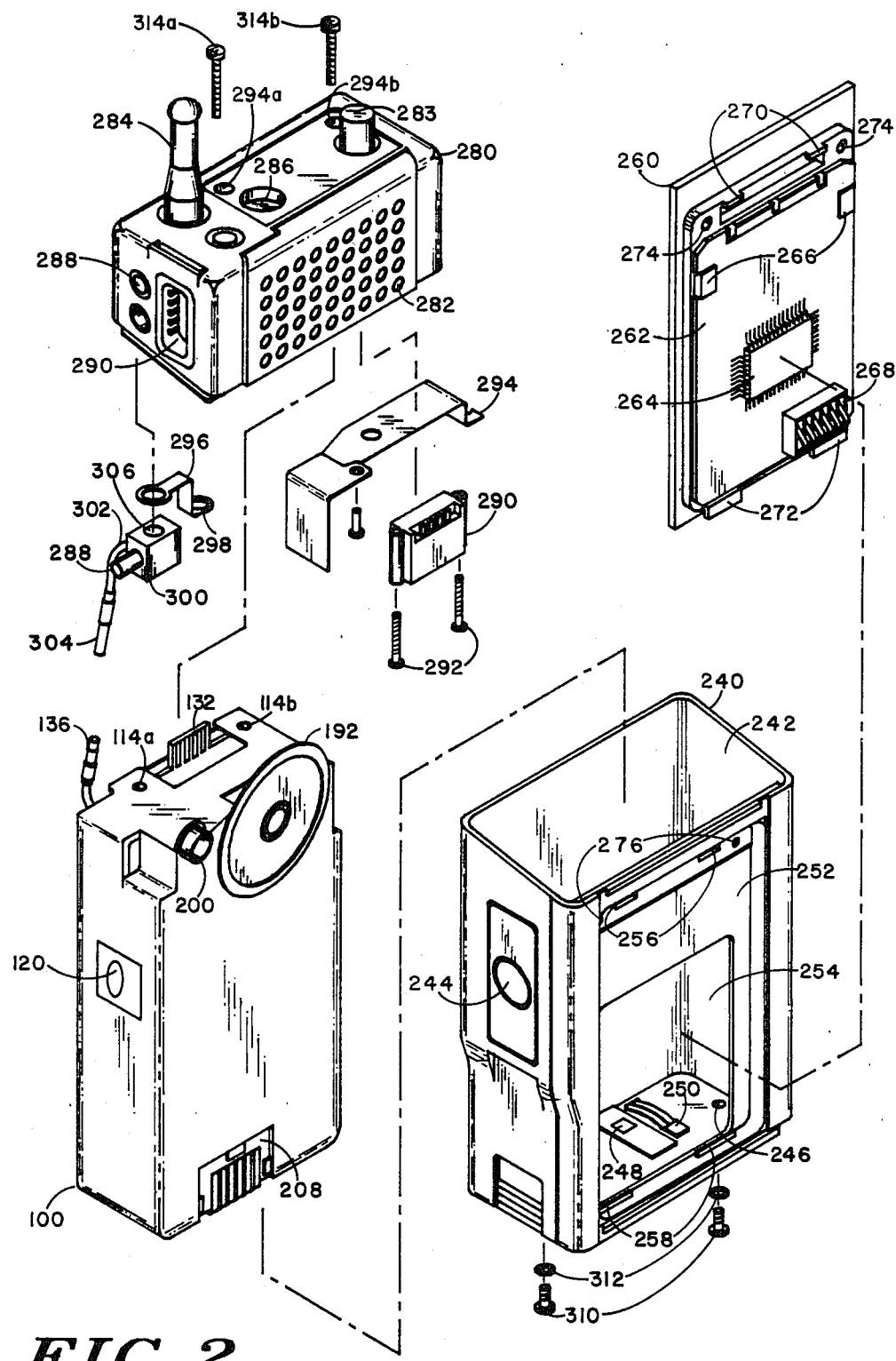
FIG. 2 is an exploded perspective view of the complete assembly including the main shield assembly, the outer housing, and the keypad/display module.

FIG. 2 is an exploded perspective view of the complete assembly illustrating the shield assembly, the lower housing, the control head, and the keypad. Lower housing 240, preferably polycarbonate plastic with a painted silverized inner surface, has an upper opening 242 for sliding shield assembly 100 into the housing. A flexible rubber switch button cover 244 protects switch 120 on frame 102. Switch button cover 244 has a polycarbonate retainer which is ultrasonically welded to lower housing 240. At the lower end of housing 240 are two holes 246 (only the right hole is visible in FIG. 2) which are in alignment with holes 116 of frame 102. Two contacts 248 and 250 provide for electrical connection between shield assembly 100 and a battery (not shown) attached to the lower end of housing 240. The front of lower housing 240 has a recessed portion 252 with an opening 254 and two pairs of interlocking slots 256 and 258 respectively at the top and bottom of the recessed portion.

A keypad and display module 260, preferably constructed from the same materials as lower housing 240, has a printed circuit board 262 with integrated circuits 264 attached to the rear of the module by tabs 266. Although the preferred application for module 260 is a keypad/display module, it is to be understood that module 260 may contain other well known electronic circuits. Printed circuit board 262, preferably a polyimide board, also has a connector 268 suitable for mating with connector 208 of shield assembly 100. Tabs 270 and 272 are suitable for mating respectively with slots 256 and 258. Threaded holes 274 of keypad/display module 260 align with holes 276 of housing 240.

Control head 280, preferably constructed from the same materials as lower housing 240, has a speaker grill 282 on its front surface. Collectively, lower housing 240 and control head 280 form the outer housing of the invention. Control head 280 has a volume control 283 and an antenna 284 attached to its upper surface. Another optional electrical component can also be placed in recess 286. An external antenna connector 288 and an external side connector 290 are positioned on the left side of control head 280. Mounted inside control head 280 is a connector 290 suitable for mating with connector 132 of shield assembly 100. Connector 290 is attached to control head 280 by screws 292. A well known flex circuit electrically interconnects connector 290 with control 283 and side connector 290. Holes 294a and 294b in control head 280 are in alignment with holes 114a and 114b of shield assembly 100. Conductive grounding strap 296 has a hole 298 in alignment with hole 114a of shield assembly 100. Antenna connector 300 has a cable 302 with an attached connector 304 suitable for mating with connector 136 of shield assembly 100. Connector 300 provides for an antenna connection either at external port 288 or to attached antenna 284 at connection 306. Conductive strap 296 is in contact with antenna connector 300.

To complete the assembly of the radio, keyboard/display module 76 is positioned in recess 252 of lower housing 240 with tabs 272 positioned in slots 258, and tabs 270 positioned in slots 256. Screws (not illustrated) are threaded into holes 276 from the rear side of recess 252 thereby retaining keypad/display module 260 to lower housing 240. Next, shield assembly 100 is attached by sliding it into housing 240. Two screws 310 with lock washers 312 are then inserted through holes 258 of housing 240 and threaded into inserts 118 of shield assembly 100. Next, control head 280 with connector 290, flex circuit 294, grounding strap 296, and antenna connector 300 installed, is attached by mating connector 304 with connector 136 and sliding control head 280 over the upper portion of shield assembly 100. When attaching control head 280 over shield assembly 100, connector 132 will be aligned with and mate with connector 290 and speaker 192 and microphone 200 will be positioned behind grill 282. Screw 314a is then inserted into hole 294a of control head 280, through hole 298 of strap 296 and threaded into hole 114a of shield assembly 100. Screw 314b is then inserted into hole 294b of control head 280 and threaded into hole 114b of shield assembly 100. This completes the assembly.

The present invention provides for 90 dB of attenuation between logic board 156 and radio board 124. Nonshielding functions are also incorporated into the invention. For example, frame 102 sinks heat from power module 128 of radio board 124 through tab 106d. Acoustic baffling is also provided for speaker 192 by baffle recess 184 and foam baffle 188 of front shield 176. The assembly also provides for shock isolation because shield assembly 100 is only attached to the outer housing (lower housing 240 and control head 280) on two sides 104a and 104b by four screws 310, and 314a and 314b or other well known fasteners. By limiting the number of attachment points between the outer housing and frame 102, tha amount of destructive mechanical energy (for example when the housing is dropped) that would be transmitted from the outer housing to the frame is greatly reduced. Although four attachment points are preferred, two or three are also acceptable. Static discharge protection is also provided because conductive strap 296 is electrically connected at one end to frame 102 through screw 314a, and at the other end the strap is in electrical contact with most of the exposed metal parts of the outer housing electrical components, thus any external static discharge that comes into contact with any of these exposed metal parts is immediately grounded to frame 102 through strap 296. In addition to providing shielding between logic board 156 and radio board 124, the shield assembly also shields the environment from any electromagnetic emitters located in assembly 100 and simultaneously shields any susceptible circuits inside shield assembly 100 from external sources of electromagnetic radiation. The assembly allows for access to either or both of logic board 156 and radio board 124 for testing and repair without having to disconnect the logic board from the radio board.

We claim:
1. A housing for electromagnetically shielding electronic circuits, said housing comprising in combination:
    a conductive frame having a multiplicity of sides surrounding a central opening;
    a first circuit substrate having front and rear surfaces, said first substrate being positioned in said opening of said frame;
    a first electromagnetic shield positioned over said rear surface of said first substrate, said first shield having front and rear surfaces and a plurality of sides substantially perpendicular to said surfaces, certain of said sides of said first shield having spring fingers contacting said frame, said first shield having an opening;
    a second circuit substrate having front and rear surfaces positioned over said rear surface of said first shield;
    an electrical interconnection between said first and second circuit substrates, said interconnection including first and second mating connectors respectively electrically connected to said first and second substrates, said electrical interconnection passing through said opening in said first shield; and
    a second electromagnetic shield positioned over said rear surface of said second circuit substrate.
2. The housing of claim 1, wherein:
    said frame has a plurality of slots; and
    said first circuit substrate has a plurality of protuberances engaging certain of said slots to retain said first substrate in said frame.
3. The housing of claim 1, wherein:
    said frame has a plurality of slots; and
    said first shield has a plurality of protuberances engaging certain of said slots to retain said first shield on said frame.

4. The housing of claim 1, wherein:
said frame has a plurality of tabs, each of said tabs having a hole; and
said first and second shields and said first and second circuit substrates each having a plurality of holes in alignment with said holes of said tabs, wherein fasteners are inserted to attach said first and second shields and said first and second substrates to said frame.

5. The housing of claim 1, further comprising a third electromagnetic shield, positioned over said front surface or said first circuit substrate, said third shield having front and rear surfaces and a plurality of sides substantially perpendicular to said surfaces, certain of said sides of said third shield having spring fingers contacting said frame.

6. The housing of claim 5, wherein:
said frame has a plurality of slots; and
certain of said sides of said third shield have a plurality of protuberances engaging certain of said slots to attach said third shield to said frame.

7. The housing of claim 5, further comprising a speaker, mounted to one of said surfaces of said third shield, whereby said shield functions as an acoustic baffle for said speaker.

8. The housing of claim 1, further comprising an outer housing enclosing said frame, said outer housing having a plurality of attachment points to said frame, said attachment points being positioned on two sides of said frame, whereby said outer housing and said attachment points provide mechanical shock isolation for said frame.

9. The housing of claim 8, wherein said outer housing includes a grounding strap and electrical components, said electrical components having exposed metal parts, said strap being electrically connected to said frame through one of said attachment points and in electrical contact with said exposed metal parts, whereby any external electrostatic charge that comes into contact with said exposed metal parts is grounded to said frame, thereby protecting said electronic circuits.

10. The housing of claim 9, wherein:
said outer housing includes a third connector, electrically connected to said components; and
said first circuit substrate includes a fourth connector, whereby said fourth connector engages said third connector.

11. The housing of claim 8, further comprising:
a third connector attached to said third shield; and
an electronic module attached to said outer housing, said module having a fourth connector engaging said third connector.

12. The housing of claim 11, wherein:
said third connector includes a circuit substrate having a plurality of contacts printed thereon; and
said third shield includes a plurality of tabs attaching said third connector to said third shield.

13. The housing of claim 1, wherein said second circuit substrate includes an electrical connector, said electrical connector including electrical contacts on one of said surfaces of said second substrate.

14. The housing of claim 1, wherein:
said first circuit substrate includes at least one power module; and
said frame includes a means for attaching said power module to said frame, whereby heat generated in said power module is conducted into said frame and dissipated.

* * * * *